(12) United States Patent
Buttay

(10) Patent No.: US 11,049,795 B2
(45) Date of Patent: Jun. 29, 2021

(54) ELECTRONIC POWER MODULE COMPRISING A DIELECTRIC SUPPORT

(71) Applicants: Supergrid Institute, Villeurbanne (FR); Universite Claude Bernard Lyon 1, Villeurbanne (FR); Ecole Centrale De Lyon, Ecully (FR); Institut National Des Sciences Appliquees De Lyon, Villeurbanne (FR); Centre National De La Recherche Scientifique, Paris (FR)

(72) Inventor: Cyril Buttay, Lyons (FR)

(73) Assignees: Supergrid Institute, Villeurbanne (FR); Universite Claude Bernard Lyon 1, Villeurbanne (FR); Ecole Centrale De Lyon, Ecully (FR); Institut National Des Sciences Appliquees De Lyon, Villeurbanne (FR); Centre National De La Recherche Scientifique, Paris (FR)

( * ) Notice: Subject to any disclaimer, the term of this patent is extended or adjusted under 35 U.S.C. 154(b) by 0 days.

(21) Appl. No.: 16/481,634

(22) PCT Filed: Jan. 29, 2018

(86) PCT No.: PCT/FR2018/050197
§ 371 (c)(1),
(2) Date: Jul. 29, 2019

(87) PCT Pub. No.: WO2018/142053
PCT Pub. Date: Aug. 9, 2018

(65) Prior Publication Data
US 2019/0385930 A1    Dec. 19, 2019

(30) Foreign Application Priority Data

Jan. 31, 2017  (FR) ...................................... 1750774

(51) Int. Cl.
*H01L 23/427* (2006.01)
*H01L 23/22* (2006.01)
(Continued)

(52) U.S. Cl.
CPC .......... *H01L 23/4275* (2013.01); *H01L 23/22* (2013.01); *H01L 23/24* (2013.01); *H01L 23/473* (2013.01)

(58) Field of Classification Search
CPC ..... H01L 23/4275; H01L 23/24; H01L 23/22; H01L 23/473; H01L 23/373;
(Continued)

(56) References Cited

U.S. PATENT DOCUMENTS 5,958,572 A * 9/1999 Schmidt .............. H01L 23/3733
174/258
8,102,652 B2 * 1/2012 Toh ........................ H01L 23/473
361/699
(Continued)

FOREIGN PATENT DOCUMENTS

DE      102011089891 A1    6/2013
EP          2277365 B1       2/2011

*Primary Examiner* — Alexander O Williams
(74) *Attorney, Agent, or Firm* — Gable Gotwals

(57) ABSTRACT

A power electronic module (1) including at least one semiconductor (5) that is connected to connection conductors (6, 7), and including a dielectric carrier (10) having both a fixed layer (9), on which at least one of said connection conductors (6) is mounted, and a movable layer (11), the fixed layer (9) and the movable layer (11) exhibiting similar dielectric permittivities and being superposed along at least one surface facing the at least one connection conductor (6).

17 Claims, 3 Drawing Sheets

(51) Int. Cl.
*H01L 23/24* (2006.01)
*H01L 23/473* (2006.01)

(58) Field of Classification Search
CPC ............... H01L 23/427; H01L 23/3735; H01L 2224/73265; H01L 23/3731; H01L 2224/48472; H01L 2224/48091; H01L 2924/00014
USPC .......................................................... 257/690
See application file for complete search history.

(56) References Cited

U.S. PATENT DOCUMENTS

| | | | | |
|---|---|---|---|---|
| 9,659,838 | B1* | 5/2017 | Harris | H01L 23/473 |
| 2005/0083655 | A1* | 4/2005 | Jairazbhoy | H01L 23/473 |
| | | | | 361/699 |
| 2008/0066942 | A1* | 3/2008 | Miller | H01B 3/04 |
| | | | | 174/36 |
| 2011/0005681 | A1* | 1/2011 | Savas | H01J 37/32036 |
| | | | | 156/345.33 |
| 2011/0108245 | A1* | 5/2011 | Tan | F28D 15/04 |
| | | | | 165/104.26 |
| 2011/0254177 | A1 | 10/2011 | Malhan et al. | |
| 2013/0256003 | A1* | 10/2013 | Duppong | H05K 1/0204 |
| | | | | 174/252 |
| 2019/0139844 | A1* | 5/2019 | Belijar | H01L 21/67126 |
| 2019/0341331 | A1* | 11/2019 | Mochizuki | H05K 1/056 |
| 2021/0028158 | A1* | 1/2021 | Takimoto | H01G 4/40 |

\* cited by examiner

ELECTRONIC POWER MODULE COMPRISING A DIELECTRIC SUPPORT

CROSS-REFERENCE TO RELATED APPLICATIONS

This application is the United States National Phase of PCT Patent Application No. PCT/FR2018/050197 filed on 29 Jan. 2018, which claims priority to French Patent Application No. 1750774 filed 31 Jan. 2017, both of which are incorporated herein by reference.

The invention pertains to the field of power electronics and relates, more particularly, to switching power circuits, the high voltage of which introduces constraints in terms of heat dissipation and electrical insulation.

Specifically, high voltages lead to problems related both to the need to dissipate the heat generated by the power components when working and to the need to electrically insulate elements that are subject to substantial differences in potential.

The object of power electronics is to modify the presentation of the electrical energy for maximum efficiency. This takes the form in particular of transforming AC to DC (rectifier circuits), transforming DC to AC (inverter circuits), modifying the RMS value of an AC voltage (dimmer circuits), modifying the mean value of a DC voltage (chopper circuits) or modifying the frequency of an AC voltage (cycloconverter circuits).

In this field, it is common to use power electronic modules that generally take the shape of a housing fitted with connection terminals and containing one or more power semiconductors that are connected to the connection terminals by connection conductors. The power semiconductors give off heat because they operate at high voltage, current and/or switching-frequency levels. The resulting heating is substantial and it is necessary to provide active or passive heat dissipation devices so that the power electronic modules operate correctly and safely. Furthermore, for high voltages, a substantial difference in potential is created between the connection conductors, which requires electrical insulation in order to prevent the formation of electric arcs, and possibly even the destruction of the module.

The solution that is typically used to solve the problems of heat dissipation and electrical insulation consists in mounting each semiconductor and its connection conductors on a carrier substrate, generally made of ceramic, which is an electrical insulator and which exhibits satisfactory thermal conduction characteristics. The ceramic additionally makes contact with a cooling device such that the heat to be dissipated is diffused through the ceramic until reaching the cooling device, which dissipates the received heat into a heat transfer fluid (air, water or another fluid).

New issues are now arising with, inter alia, the proliferation of energy sources, in particular the production of renewable energies, and the connection of these energies to the grid. The production of energy from disparate sources such as wind turbines (alternating current) or photovoltaic panels (direct current) necessitates the introduction of stations for converting alternating current to direct current, or vice versa, within the electrical distribution grid. The distribution of this energy further requires the grid itself to be redesigned, for example by providing networks for transmitting high-voltage direct current. This results in particular in power electronic modules being introduced into electrical networks for novel purposes and in switching direct current, which is more difficult in terms of insulation, at high voltages. In addition to these new constraints, there is a continuous trend in the direction of decreasing the dimensions of power electronic modules and/or of increasing the density of semiconductors contained therein, which applies across the fields of application.

These new issues require power electronic modules to have improved heat dissipation capabilities and, at the same time, better electrical insulation.

The ceramics used in the prior art for producing carrier substrates, for example aluminum or boron nitride, perform better in terms of thermal conductivity (for heat dissipation) and electrical insulation, at a cost that is compatible with the power electronics industry. There are materials that perform better than these ceramics both in terms of conductivity and in terms of insulation, but they are either prohibitively expensive, excluding them from electronics applications (such as for example diamond), or toxic or represent an environmental hazard, thereby again excluding them from these applications (such as for example beryllium oxide).

As such, the typical solution for improving the electrical insulation of power electronic modules of the prior art consists in increasing the thickness of the carrier substrate when they are subject to harsher conditions. However, this increase in thickness also results in a decrease in heat dissipation capacity, since the heat must first pass through a greater thickness of substrate before being drawn away by a heat transfer fluid. The thermal conductivity of the substrate material, although high, is far from ideal and adjusting its thickness again just amounts to a trade-off between the heat dissipation function and the electrical insulation function. Promoting one is to the detriment of the other.

U.S. Pat. No. 8,432,030 describes a power electronic module in which this problem is attenuated by increasing the heat dissipation capacity of the module by means of a second cooling device. This solution proposes a conventional cooling device interacting with the carrier substrate of a semiconductor and further proposes a second cooling device acting on the opposite face of the semiconductor. Doubling the cooling means provides, mathematically speaking, better heat dissipation but constitutes a more complex, expensive, and less compact, solution.

Document EP2277365 describes a system for cooling power electronic modules implementing a solution akin to the preceding one, in which two cooling devices act on either side of a semiconductor. The heat dissipation capacity is also increased through the use of a two-phase fluid as a heat transfer fluid. Since the two-phase fluid has a low boiling point, it transitions from the liquid state to the gas state on contact with the elements to be cooled, the phase change enhancing the cooling performance. This solution likewise increases the cooling capacity of the module at the cost of greater complexity.

In the various cooling modules of the prior art, such as those described above, harsher conditions demanding an increase in performance in terms of electrical insulation result in an increase in the thickness of the carrier substrate, which in turn results in a decrease in cooling performance and this decrease is subsequently attenuated by the more complex cooling devices described above.

The object of the invention is to improve on the power electronic modules of the prior art.

To this end, the subject of the invention is a power electronic module including at least one semiconductor that is connected to connection conductors, and also including a dielectric carrier having both a fixed layer, on which at least one of said connection conductors is mounted, and a movable layer, the fixed layer and the movable layer exhibiting similar dielectric permittivities and being superposed along at least one surface facing the at least one connection conductor.

The permittivity of a material, expressed in coulombs per volt and per meter ($C \cdot V^{-1} \cdot m^{-1}$) or in farads per meter ($F \cdot m^{-1}$) allows the effect of an electric field on this material to be measured. This dielectric permittivity may also be expressed as a dimensionless quantity referred to as the "relative permittivity" or "dielectric constant of the material" which is the factor by which the dielectric permittivity of vacuum is multiplied in order to obtain the dielectric permittivity of the material in question.

The feature according to which the fixed layer and the movable layer are of similar dielectric permittivity implies that the dielectric permittivity of the fixed layer and the dielectric permittivity of the movable layer take values that are close enough for the assembly formed by these two layers in superposition to exhibit uniform behavior when subjected to an electric field, thereby allowing the electrical potential gradients to be distributed uniformly throughout the thickness of the dielectric carrier. The dielectric permittivity of the fixed layer and the dielectric permittivity of the movable layer are therefore equal or close enough to allow this uniform behavior. Breakdown effects, and more generally the effects of modules deteriorating under high voltage, are promoted at areas of peak potential created for example by sharp angles. Conversely, a uniform distribution of potential gradients allows these effects to be avoided.

According to one preferred feature, the respective dielectric permittivities of the dielectric layers of the carrier are said to be similar when the difference between the dielectric permittivity of the movable layer and the dielectric permittivity of the fixed layer is smaller than 50%, or even 20%, of the dielectric permittivity of the fixed layer.

Arranging the dielectric carrier in layers and homogenizing the dielectric permittivities makes it possible for the electrical potential gradients to be distributed optimally when the dielectric carrier is subjected to an electric field, such that the electrical insulation capabilities of the dielectric carrier are improved regardless of the thickness of the fixed layer, this layer then potentially being sized to promote heat exchange, i.e. made thinner.

The invention runs counter to common reasoning in the technical field since it proposes decorrelating performance in terms of cooling and performance in terms of electrical insulation such that increasing one is not to the detriment of the other. The functions of carrier substrate and of cooling device of the prior art are here performed by one and the same dielectric carrier, the two layers of which, one fixed, the other movable, each participating in both the cooling and insulation functions without these functions coming into conflict.

Furthermore, another physical characteristic plays a role in the electric field distribution in a material, in particular when the voltage to be insulated is continuous: its electrical conductivity. According to another feature, the power electronic module may have a fixed layer and a movable layer that exhibit comparable electrical conductivities. Since electrical conductivity varies widely for insulators (from $10^{-8}$ to $10^{-20}$ $S \cdot m^{-1}$), the electrical conductivities of the fixed layer and of the movable layer will be considered to be comparable when they are to within a ratio of 10, i.e. when the highest electrical conductivity is 10 times lower than the lowest electrical conductivity.

The power electronic module may include the following additional features, either individually or in combination:

the power electronic module further includes a filler gel arranged around the semiconductor and the connection conductors, the dielectric permittivity of this filler gel being similar to that the fixed layer;

the movable layer makes contact with the fixed layer along a textured contact interface;

the fixed layer is composed of a dielectric ceramic substrate;

the movable layer is composed of a dielectric fluid;

the dielectric fluid of the movable layer is contained within a chamber extending across the entire area of the fixed layer, the fixed layer and the movable layer thus having identical areas, which are superposed; or, alternatively, the fluid of the movable layer is contained within one or more smaller chambers extending only across the area facing the at least one connection conductor, the fixed layer and the movable layer thus being superposed over the entire surface facing the at least one connection conductor;

said one or more chambers are sealed chambers in which the mobility of the fluid is provided by natural convection; or, alternatively, said one or more chambers are connected to a cooling circuit;

the boiling temperature of the fluid of the movable layer is lower than the temperature of the power electronic module in operation, so as to provide two-phase cooling.

Whatever the material of the fixed layer, the invention allows the thickness thereof to be decreased, even in the case of an increased need for insulation, and allows this thickness to be decreased until it is below the minimum thickness dictated by its breakdown voltage, referred to here as the "critical thickness of insulation". For example, if the breakdown voltage of the ceramic used for the fixed layer of the dielectric carrier is 25 kV/mm (including the usual safety coefficients), then the critical thickness of insulation will be 1 mm for a module intended for 25 kV. In this case, it will then be possible for the thickness of the fixed layer to be less than 1 mm. The insulating action of the fixed layer is then supplemented by the movable layer, whatever the material, whether solid or fluid, to reach the required level.

Thus, although the thickness of the fixed layer may be less than the critical thickness of insulation, taking into account the dielectric strength of the fixed layer and the maximum voltage of the power electronic module, i.e. the maximum voltage that may be applied to the connection conductors, the sum of the thickness of the fixed layer and of the thickness of the movable layer is greater than said critical thickness of insulation.

One preferred exemplary embodiment of the invention will now be described with reference to the appended drawings, in which.

Figure 1:
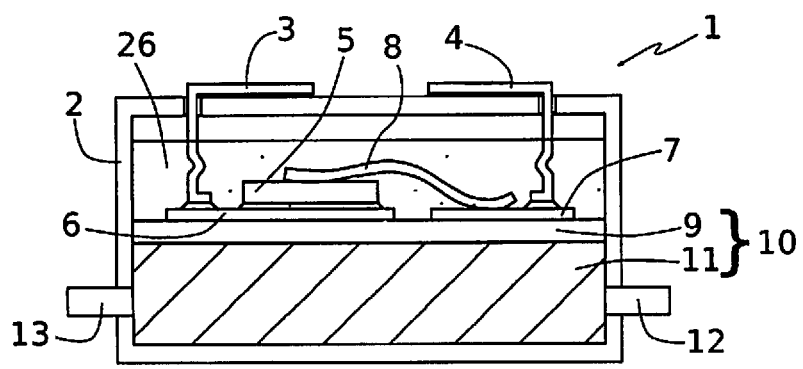
FIG. 1 is a sectional view of a power electronic module according to the invention.
Figure 5:
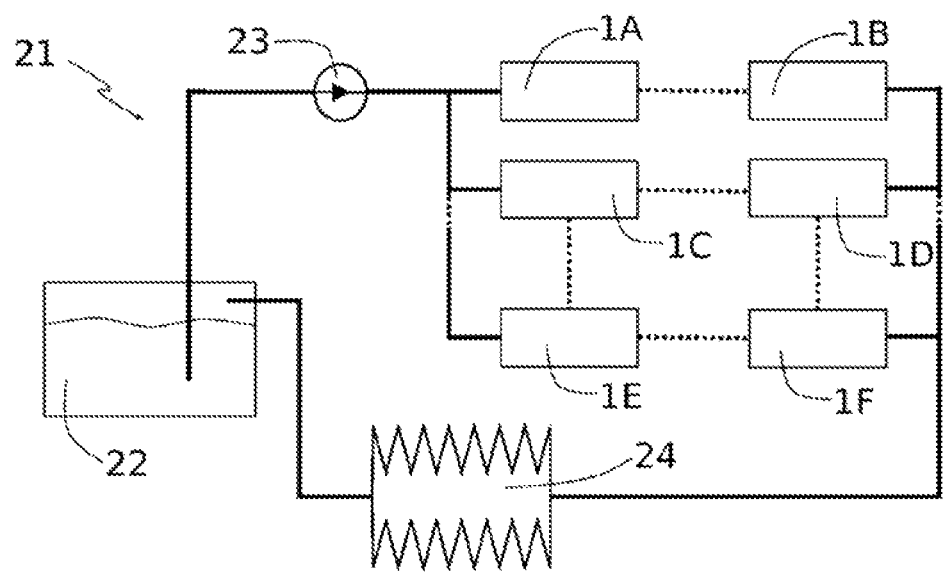
Figure 6:
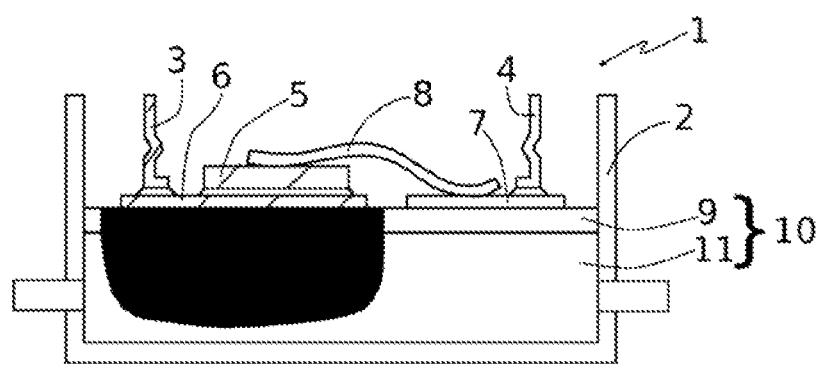
Figure 7:
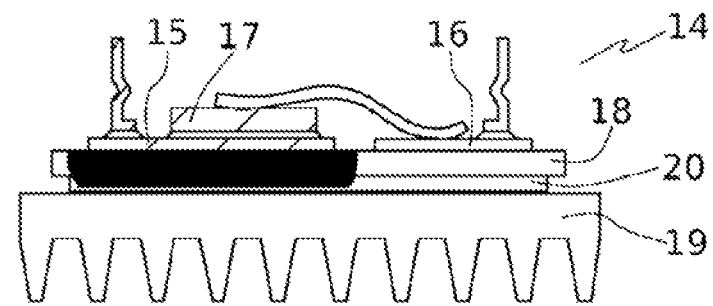
Figure 8:
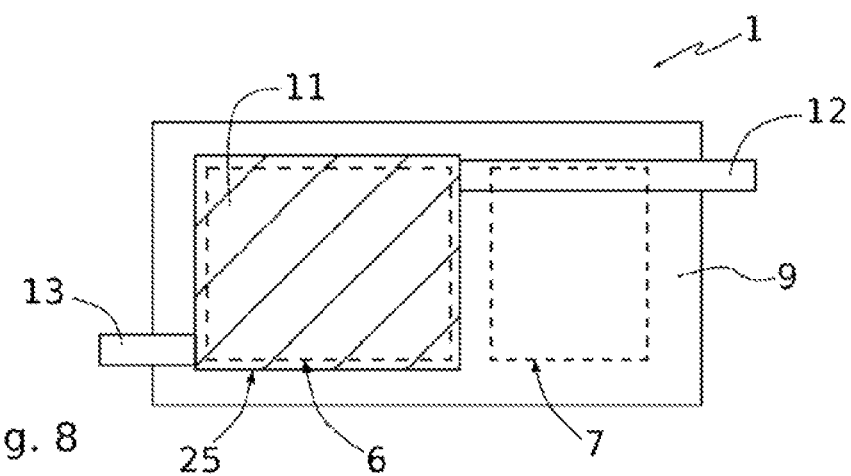
Figure 9:
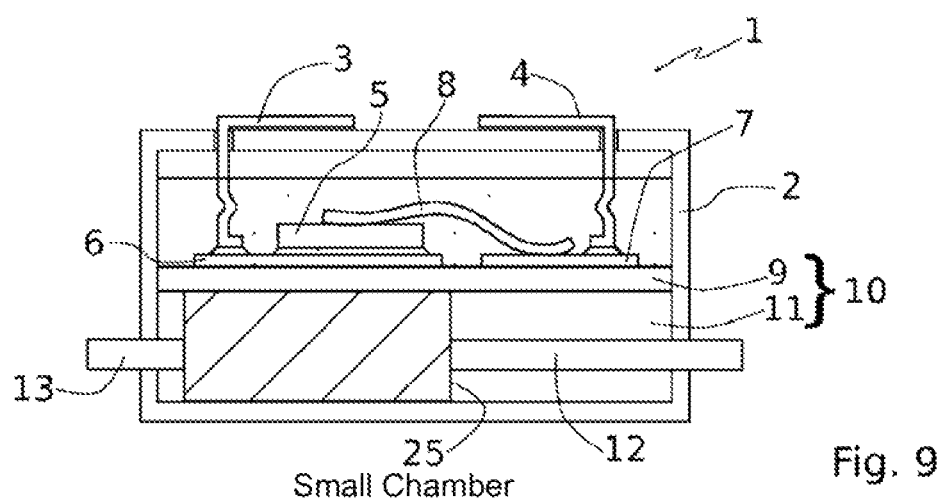

FIG. 5 schematically shows the heat transfer fluid circuit of the power electronic module of FIG. 1;

FIG. 6 is a partial, sectional view of some elements from FIG. 1, showing the distribution of the electrical potential in the dielectric carrier;

FIG. 7 is similar to FIG. 5, for a power electronic module of the prior art;

FIG. 8 is a bottom view of one variant embodiment of the power electronic module according to the invention;

FIG. 9 is a sectional view of the power electronic module according to the variant of FIG. 8.

FIGS. 1 to 4 show a power electronic module 1 according to the invention. It includes a housing 2 fitted with a first terminal 3 and with a second terminal 4 that are intended for connecting the module 1. To simplify the description, the power electronic module 1 is a simple module including two terminals 3, 4 and a single semiconductor 5 provided with two poles.

Figure 2:
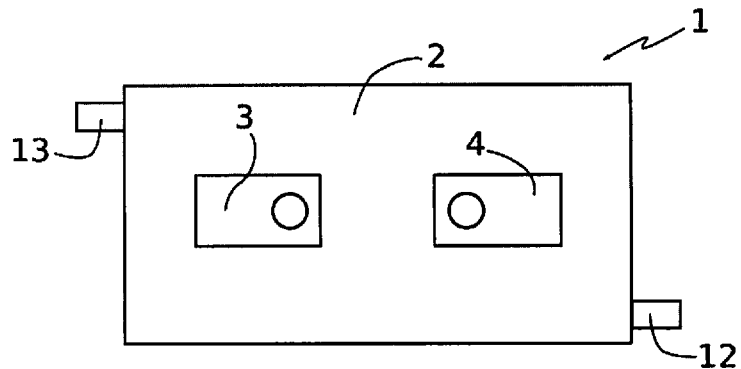
FIG. 2 is a top view of the power electronic module of FIG. 1.

The top view of FIG. 2 shows the two terminals 3, 4, which are accessible from outside the housing 2 in order to electrically connect the module 1 to the circuit for which it is intended. The first terminal 3 and second terminal 4 are connected, inside the module 1, to a first connection conductor 6 and to a second connection conductor 7, respectively. The semiconductor 5 which, in the present example, has two poles, is connected to each of the connection conductors 6, 7. The semiconductor 5 is thus connected by one of its faces to the first connection conductor 6 via a soldered wire 8, forming the joint for its first pole, and is itself soldered by its opposite face to the second connection conductor 7, forming the joint for its second pole.

Figure 3:
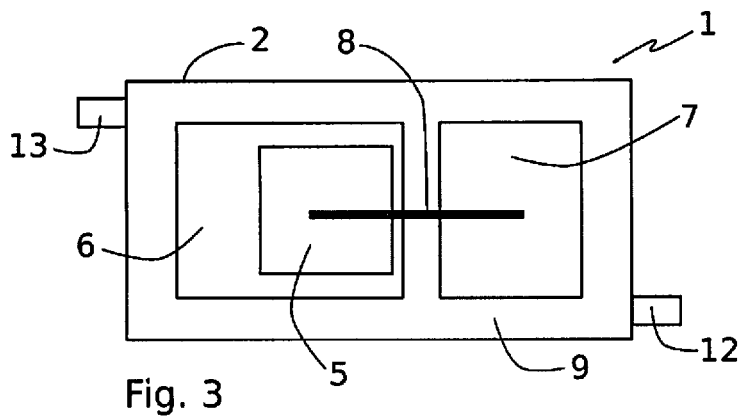
FIG. 3 is a top view of the power electronic module of FIG. 1 without its housing.
Figure 4:
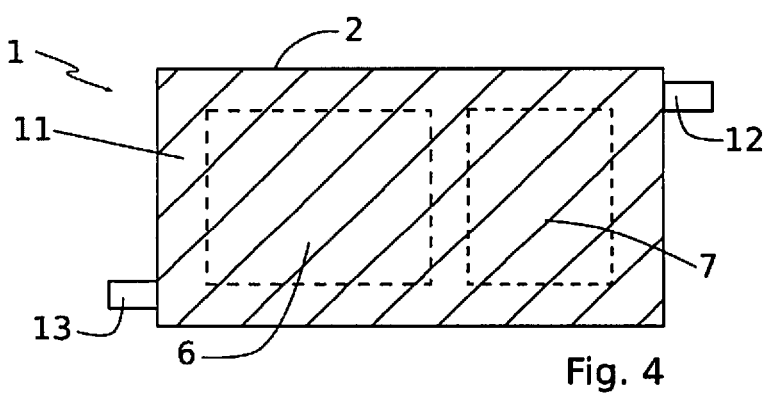
FIG. 4 is a bottom view of the power electronic module of FIG. 1.

The two connection conductors 6, 7 are, in the present example, two copper rectangles as shown in FIG. 3, which is a top view of the module 1 without its housing. These two connection conductors 6, 7 are mounted on the fixed layer 9 of a dielectric carrier 10, which also includes a movable layer 11 below the fixed layer 9. The movable layer 11 has been hatched to improve clarity. The fixed layer 9 and the movable layer 11 of the dielectric carrier 10 are, in the present example, parallelepipeds, the thickness of which can be seen in FIG. 1 and the length and the width of which can be seen in FIG. 4 (in the bottom view of FIG. 4, showing the module 1 without its housing, the dielectric carrier 10 occupies the hatched area).

The fixed layer 9 provides the mechanical support and attachment for the semiconductor 5, and also thermally conducts the heat given off by the semiconductor 5 toward the movable layer 11. It also contributes, but only partly, to the electrical insulation between the connection conductors 6, 7.

The thickness of the fixed layer 9 may thus be just enough to provide the semiconductor 5 with mechanical strength without being dictated by electrical insulation needs. In particular, this thickness may not be enough to provide, on its own, the necessary dielectric strength when the module 1 is connected to a certain voltage, given that the movable layer also participates in the dielectric strength, as explained below.

The movable layer 11, for its part, provides or supplements the electrical insulation, preventing electric arcs within the module 1, and also removes the heat received from the fixed layer 9.

The electrical insulation function of the movable layer 11 is carried out through this layer making direct contact with the fixed layer 9 and through the choice of its constituent material, the properties of which in reaction to the effect of an electric field are akin to those of the fixed layer 9, which manifests as the dielectric permittivity of the fixed layer 9 being akin to the dielectric permittivity of the movable layer 11. The fixed layer 9 and the movable layer 11 together form a coherent insulator, a total thickness of which is to be sized so as to be sufficient according to the dielectric strength required for a given voltage that is to be applied to the module 1 through its terminals 3, 4 being connected to a circuit. The total thickness of the dielectric carrier 10 corresponds to the thickness of the fixed layer 9 and of the movable layer 11 combined.

According to one variant (not shown), the movable layer makes contact with the fixed layer along a textured contact interface. The fixed layer may thus possess a fin-like, chicane-like or any other patterned texture so as to promote the interlocking of the fixed layer and the movable layer.

According to another variant, an electrical conductivity of the material of the movable layer 11 is moreover comparable to the thermal conductivity of the fixed layer 9 so as also to promote the distribution of the electric field throughout the thickness of the dielectric carrier 10. The electrical conductivities of the fixed layer 9 and of the movable layer 11 are therefore here to within a factor of 10.

In the present example, the material chosen to produce the movable layer 11 is a dielectric fluid that is contained within a chamber defined by the fixed layer 9 and the housing 2 (see FIG. 1). The movable layer 11 extends across the entire area of the fixed layer 9, the fixed layer 9 and the movable layer 11 thus having identical areas and being superposed over this entire area. The heat removal function is carried out by the movable layer 11 moving via a fluid inlet 12 and a fluid outlet 13, which are connected to a cooling circuit that sets up a fluid flow allowing heat to be removed.

Such a cooling circuit 21 is shown in FIG. 5. It allows the fluid forming the movable layer 11 to flow so as to allow heat to be removed from the power electronic module 1. The cooling circuit 21 includes, in the illustrated example, a tank 22 and a pump 23 that allow the fluid to flow through as many power electronic modules 1 as required. Indeed; a single cooling circuit 21 may be provided for an installation including a plurality of modules 1. The power electronic modules 1A, 1B, 1C, 1D, 1E, 1F of FIG. 5 thus make use of the same fluid to form their respective movable layers 11. The dotted connections between these power electronic modules 1A, 1B, 1C, 1D, 1E, 1F indicate that the fluid may flow through modules connected in series and/or in parallel.

Moreover, the fluid may be chosen to exhibit two-phase behavior and, in this case, the cooling circuit 21 includes a condenser 24. The boiling temperature of such a two-phase fluid is lower than that to which it is subjected in the power electronic modules 1A, 1B, 1C, 1D, 1E, 1F. The fluid thus leaves the pump 23 in the liquid state, is at least partly vaporized in the power electronic modules 1A, 1B, 1C, 1D, 1E, 1F, and then returns to the liquid state in the condenser 24. The movable layer 11 of the power electronic module 1 consists, in this case, of flowing liquid, gas or a combination of the two.

Alternatively, the fluid may remain confined within the chamber defining the movable layer 11, without a cooling circuit 21, such that the movement of the fluid takes place by means of natural convection, resulting in motion between the fluid in proximity to the fixed layer 9, which is hotter, and the fluid further away from the fixed layer 9, which is cooler. This internal movement of the fluid is enough to set the movable layer 11 in motion when the heat dissipation requirements are limited, i.e. for a semiconductor 5 that is subject to less heating.

In any case, the cooling may be enhanced by any known additional feature for increasing heat dissipation, such as heat dissipation fins on the housing 2.

According to one alternative (not shown), instead of a fluid movable layer 11, the movable layer 11 may be produced in the form of a flexible or stiff strip of material to which a motion relative to the fixed layer 9 is imparted, such that as this strip of material shifts with respect to the fixed layer 9, heat is removed.

The movable layer 11 may therefore consist of a solid, liquid or gas, stiff or flexible material, or of a combination thereof. Whatever the makeup of the movable layer 11, it is in motion relative to the fixed layer 9 such that the dielectric carrier 10 allows the heat produced by the semiconductor 17 to be removed.

The dielectric permittivity of the constituent material of the movable layer 11 is moreover akin to that of the constituent material of the fixed layer 9. In the present example, the material chosen to form the fixed layer 9 is an aluminum nitride, the relative permittivity of which is equal to 8.5, and the material chosen to form the movable layer 11 is a fluoroketone fluid, the relative permittivity of which is equal to 7. The difference between the dielectric permittivity values of the fixed layer 9 and of the movable layer 11 thus does not exceed 20% of the dielectric permittivity of the fixed layer 9. Alternatively, this difference may reach 50% of the dielectric permittivity of the fixed layer 9. The dielectric carrier 10 thus forms a uniform set in terms of dielectric permittivity, exhibiting uniform behavior in the presence of an electric field.

The power electronic module 1 may optionally include a dielectric filler gel 26 in which the semiconductor 5 and its connections are immersed (the gel 26 is shown in FIG. 1). The material of the gel 26 may also be chosen so that a dielectric permittivity is akin to that of the fixed layer 11, such that the assembly formed by the dielectric carrier 10 and the gel 26 exhibits uniform behavior in the presence of an electric field. The advantages in having a coherent assembly in terms of dielectric permittivity for the fixed layer 9 and the movable layer 11 may thus be extended to the assembly formed by the fixed layer 9, the movable layer 11 and the gel 26. As above, the dielectric permittivity of the gel 26 is said to be akin to that of the fixed layer 9 when the difference between them does not exceed 20%, and alternatively 50%, of the dielectric permittivity of the fixed layer 9.

The view of FIG. 6, which is similar to that of FIG. 1, schematically shows the electrical potential distribution in the dielectric carrier 10. It is assumed, in this example, that the power electronic module 1 is connected such that the first terminal 3, and hence the first connection conductor 6, are at zero potential, while the second terminal 4, and hence the second connection conductor 7, are at a high potential, for example 5000 V DC.

An electrical potential gradient then arises in the constituent materials of the power electronic module 1, between the elements at 0 potential (shown as hatched in FIG. 6) and the elements at the potential of 5000 V (shown without hatching in FIG. 6). The electrical potential gradient in the dielectric carrier 10 is shown as a gradation in FIG. 6, in which the transition from darkest to lightest represents the transition from the highest electrical potential (5000 V) to the lowest electrical potential (0 V). The power electronic module 1 allows the electrical potential to diffuse optimally by allowing the electrical potential gradient to be distributed across the entire thickness of the dielectric carrier 10, which, despite being produced in two layers 9, 11, forms a uniform assembly in terms of dielectric permittivity, which is favorable to such a uniform distribution of the electrical potential gradient.

FIG. 7 is a similar view to that of FIG. 6, but instead shows a power electronic module 14 of the prior art. FIGS. 6 and 7 allow the distribution of electrical potential according to the invention and according to the prior art to be compared. With reference to FIG. 7, the power electronic module 14 of the prior art includes a semiconductor 17 connected to a first connection conductor 15 and to a second connection conductor 16. These connection conductors 15, 16 are mounted on an insulating carrier substrate 18 which is provided, on its opposite face, with a cooling device 19. A thermal bridge 20, made of copper, thermally connects the carrier substrate 18 to the cooling device 19, which may be passive (as shown in FIG. 7) or active (by virtue of a heat transfer fluid flowing through the cooling device 19).

Under the same conditions as above (first connection conductor 15 at the potential of 0 V and second connecting conductor 16 at the potential of 5000 V DC), the electrical potential gradient is likewise represented by a gradation in this FIG. 7 depicting the prior art. The carrier substrate 18 performs the dual functions of conducting the heat to be dissipated between the semiconductor 17 and the cooling device 19 and of providing all of the electrical insulation for the connection conductors 15, 16. The electrical potential may therefore be distributed only across the thickness of the carrier substrate 18. At the exact location where the base of the carrier substrate 18 makes contact with the thermal bridge 20, the electrical potential must have fallen to the value of 0.

This FIG. 7, which illustrates the prior art, allows, by comparison, the advantageous distribution of the electrical potential over a greater thickness, made possible by the invention illustrated in FIG. 6, to be highlighted.

FIGS. 8 and 9 relate to one variant embodiment of the movable layer of the power electronic module according to the invention. They are similar to FIGS. 4 and 1, respectively, and the corresponding elements are numbered in the same way.

The power module 1 according to this variant embodiment also includes a semiconductor 5 that is connected to a first connection conductor 6 and a second connection conductor 7, the overall assembly being mounted on a dielectric carrier 10 consisting of a fixed layer 9 and of a movable layer 11. The variant embodiment specifically targets the movable layer 11, which is here limited to the surface facing the first connection conductor 6. FIG. 8 is a bottom view of the power electronic module 1, schematically shown without its housing 2, which shows, in dashed lines, the outlines of the first connection conductor 6 and of the second connection conductor 7. An enclosure 25 defines the chamber occupied by the movable layer 11, this chamber extending across the entire area facing the outline of the first connection conductor 6 (see FIG. 8). In this way, the fixed layer 9 and the movable layer 11 are superposed facing the connection conductor 6 (see FIG. 9). In other words, outside the outline defined by the first connection conductor 6, the dielectric carrier 10 has only one layer consisting of the fixed layer 9, whereas inside this outline, the dielectric carrier 10 consists of the fixed layer 9 and of the movable layer 11 in superposition. The fluid inlet 12 and the fluid outlet 13 are arranged correspondingly so as to allow the fluid to be channeled to the enclosure 25.

The arrangement of the dielectric carrier 10 according to the variant of FIGS. 8 and 9 is intended for connection in a way that is comparable to that of the example of FIG. 6, i.e. for the second connection conductor 7 to be at 0 potential and the first connection conductor 6 to be at a high potential. The electrical potential will then be distributed across both layers 9, 11 of the dielectric carrier 10, in a manner similar to that shown in FIG. 6.

Like the variant embodiment of FIGS. 8 and 9, the dielectric carrier may consist of a single extended fixed layer and of one or more smaller movable layers that are arranged facing the one or more connection conductors for which it is necessary to provide space for the distribution of the electrical potential.

Other variant embodiments of the power electronic module may be implemented without departing from the scope of the invention. For example, the shapes of the fixed layer 9 and of the movable layer 11 may be more complex than just the simple rectangles described here for ease of understanding, and the same applies for the connection conductors 6, 7. Furthermore, beyond the simple example illustrated here, the power electronic module 1 may include a plurality, or even a very large number, of connection conductors 6, 7 and of corresponding semiconductors, which may be for example power transistors, power thyristors, power diodes, regulators, controllers, amplifiers, etc.

The invention claimed is:

1. A power electronic module (1) including at least one semiconductor device (5) that is connected to a plurality of connection conductors (6, 7), said module comprises: a dielectric carrier (10) having both a fixed layer (9) being formed of a first material having a first dielectric permittivity, on which at least one of said plurality of connection conductors (6, 7) is mounted, and a movable layer (11) being formed of a second material different from the fixed layer having a second dielectric permittivity, the first material and second material selected to exhibit similar dielectric permittivity, the fixed layer (9) and the movable layer (11) exhibiting the similar dielectric permittivities and being superposed along at least one surface facing the at least one connection conductor (6, 7).

2. The module as claimed in claim 1, wherein difference between the dielectric permittivity of the movable layer (11) and the dielectric permittivity of the fixed layer (9) is smaller than 50% of the dielectric permittivity of the fixed layer (9).

3. The module as claimed in claim 2, wherein the difference between the dielectric permittivity of the movable layer (11) and the dielectric permittivity of the fixed layer (9) is smaller than 20% of the dielectric permittivity of the fixed layer (9).

4. The module as claimed in claim 1 further includes a filler gel (26) arranged around the at least one semiconductor device (5) and the plurality of connection conductors (6, 7), a dielectric permittivity of the filler gel (26) being similar to that of the fixed layer (9).

5. The module as claimed in claim 1 wherein the movable layer (11) makes contact with the fixed layer (9) along a textured contact interface.

6. The module as claimed in claim 1 wherein an electrical conductivity of the movable layer (11) is comparable to an electrical conductivity of the fixed layer (9).

7. The module as claimed in claim 1, wherein a thickness of the fixed layer (9) is less than a critical thickness of insulation, taking into account a dielectric strength of the fixed layer (9) and a maximum voltage of the power electronic module (1).

8. The module as claimed in claim 7, wherein a sum of the thickness of the fixed layer (9) and of a thickness of the movable layer (11) is greater than said critical thickness of insulation.

9. The module as claimed in claim 1, wherein the fixed layer (9) is composed of a dielectric ceramic substrate.

10. The module as claimed in claim 1, wherein the movable layer (11) is composed of a dielectric fluid.

11. The module as claimed in claim 10, wherein the dielectric fluid of the movable layer (11) is contained within a chamber extending across an entire area of the fixed layer (9), the fixed layer (9) and the movable layer (11) thus having identical areas, which are superposed.

12. The module as claimed in claim 10, wherein the fluid of the movable layer (11) is contained within at least one smaller chamber (25) extending only across an area facing the at least one connection conductor (6, 7), the fixed layer (9) and the movable layer (11) thus being superposed over the entire surface facing the at least one connection conductor (6).

13. The module as claimed in claim 11, wherein said chamber is a sealed chamber in which the mobility of the dielectric fluid is provided by convection.

14. The module as claimed in claim 11 wherein said chamber is connected to a cooling circuit.

15. The module as claimed in claim 10, wherein a boiling temperature of the dielectric fluid of the movable layer (11) is lower than a temperature of the power electronic module (1) in operation, so as to provide two-phase cooling.

16. The module as claimed in claim 12 wherein said at least one smaller chamber is a sealed chamber in which the mobility of the fluid is provided by convection.

17. The module as claimed in claim 12, wherein said at least one smaller chamber is connected to a cooling circuit.

* * * * *